(12) United States Patent
Kim et al.

(10) Patent No.: US 8,674,475 B2
(45) Date of Patent: Mar. 18, 2014

(54) ANTIFUSE AND METHODS OF OPERATING AND MANUFACTURING THE SAME

(75) Inventors: Deok-kee Kim, Seoul (KR); Jung-hun Sung, Yongin-si (KR); Sang-moo Choi, Gyeongju-si (KR); Soo-jung Hwang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 759 days.

(21) Appl. No.: 12/385,391

(22) Filed: Apr. 7, 2009

(65) Prior Publication Data

US 2009/0256624 A1    Oct. 15, 2009

(30) Foreign Application Priority Data

Apr. 11, 2008   (KR) .................. 10-2008-0033880

(51) Int. Cl.
*H01L 23/62* (2006.01)

(52) U.S. Cl.
USPC ............ 257/530; 257/E23.147; 257/E21.409; 438/467

(58) Field of Classification Search
USPC ..................... 257/530, E23.147, E21.409
See application file for complete search history.

(56) References Cited

U.S. PATENT DOCUMENTS

| | | | | |
|---|---|---|---|---|
| 5,572,050 A | * | 11/1996 | Cohen | 257/209 |
| 7,564,707 B2 | * | 7/2009 | Kleveland | 365/96 |
| 7,714,326 B2 | * | 5/2010 | Kim et al. | 257/50 |
| 7,723,820 B2 | * | 5/2010 | Kim et al. | 257/530 |
| 2009/0008702 A1 | * | 1/2009 | Ramaswamy | 257/324 |
| 2009/0184373 A1 | * | 7/2009 | Kaindl et al. | 257/364 |

* cited by examiner

*Primary Examiner* — Wensing Kuo
(74) *Attorney, Agent, or Firm* — Harness, Dickey & Pierce, P.L.C.

(57) ABSTRACT

Provided are an antifuse and methods of operating and manufacturing the same. The antifuse may include first and second conductors separate from each other; a dielectric layer for an antifuse between the first and second conductors; and a diffusion layer between one of the first and second conductors and the dielectric layer.

19 Claims, 11 Drawing Sheets

+
ANNEALING

+
ANNEALING

+
ANNEALING

ANTIFUSE AND METHODS OF OPERATING AND MANUFACTURING THE SAME

PRIORITY STATEMENT

This application claims priority under U.S.C. §119 to Korean Patent Application No. 10-2008-0033880, filed on Apr. 11, 2008, in the Korean Intellectual Property Office (KIPO), the entire contents of which are incorporated herein by reference.

BACKGROUND

1. Field

Example embodiments relate to an electrical device, and more particularly, to an antifuse and methods of operating and manufacturing the antifuse.

2. Description of the Related Art

An antifuse is an electrical device, which operates in the opposite way of a fuse. For example, whereas a fuse starts with a lower resistance state and then changes to a higher resistance state by a programming operation, an antifuse starts with a higher resistance state and changes to a lower resistance state by a programming operation.

Antifuses are used for various purposes, e.g., repair of defective cells, storage of chip identification, and circuit customization, in semiconductor memory or logic devices. For example, cells that are judged as defective among a relatively large number of cells of a memory device may be replaced with redundancy cells by antifuses. Consequently, the problem of decrease of yield due to defective cells may be overcome.

However, a voltage of at least 5 V may be required to program a conventional antifuse. Due to this relatively high programming voltage, off leakage current of a transistor may increase in a cell region and a peripheral circuit region, the reliability of the transistor may decrease, and the power consumption may increase.

SUMMARY

Example embodiments provide an antifuse and methods of operating and manufacturing the antifuse.

According to example embodiments, an antifuse may include first and second conductors separate from each other; a dielectric layer for an antifuse between the first and second conductors; and a diffusion layer between one of the first and second conductors and the dielectric layer.

The diffusion layer may include a material diffused into the dielectric layer, the material reducing the energy band gap of the dielectric layer and/or increases a dielectric constant of the dielectric layer. The dielectric layer may include at least one of an Al oxide, a Si oxide, and a Si nitride, and the diffusion layer includes Cr. The dielectric layer, the diffusion layer, and the second conductor may be sequentially stacked on the first conductor defining a first stack pattern. The antifuse may further include a cathode and an anode contacting both ends of the first stack pattern, the widths of the cathode and the anode being greater than the width of the first stack pattern.

The first conductor may be a portion of a substrate, and the second conductor may be a gate conductive layer, and the antifuse may further include a source and a drain on the substrate on both sides of the first stack pattern. The gate conductive layer may include a high resistance region having greater electrical resistance than other portions of the gate conductive layer.

According to example embodiments, an antifuse may include first and second conductors separate from each other, and a dielectric layer for an antifuse between the first and second conductors, wherein the dielectric layer may include at least two different dielectric materials bonded to one another.

The dielectric layer may include first and second dielectric materials that have different energy band gaps. The first dielectric material may include one of an Al oxide, a Si oxide, and a Si nitride, and the second dielectric material may include a Cr oxide. The dielectric layer and the second conductor may be sequentially stacked on the first conductor defining a first stack pattern, and the antifuse may further include a cathode and an anode contacting both ends of the first stack pattern, the widths of the cathode and the anode being greater than the width of the first stack pattern.

The first conductor may be a portion of a substrate, and the second conductor is a gate conductive layer, and the antifuse may further include a source and a drain on the substrate on both sides of the first stack pattern. The gate conductive layer may include a high resistance region having greater electrical resistance than other portions of the gate conductive layer.

According to example embodiments, a method of operating the antifuse may include diffusing at least a portion of the diffusion layer to the dielectric layer. Diffusing at least a portion of the diffusion layer to the dielectric layer may include applying a current to either of the first or the second conductor contacting the diffusion layer. After diffusing at least a portion of the diffusion layer to the dielectric layer, the method may further include measuring the capacitance of the antifuse or a current between the first and second conductors.

After diffusing at least a portion of the diffusion layer to the dielectric layer, the method may further include breaking down the dielectric layer; and measuring a current between the first and second conductors. The dielectric layer, the diffusion layer, and the second conductor may be sequentially stacked on the first conductor to define a first stack pattern, and the antifuse may further include a cathode and an anode contacting both ends of the first stack pattern, and the widths of the cathode and the anode are greater than the width of the first stack pattern.

The first conductor may be a portion of a substrate, and the second conductor is a gate conductive layer, and the method may further include providing a source and a drain on the substrate on both sides of the first stack pattern. The method may further include measuring one of a drain current, a source current, a gate current, and a substrate current of a transistor including the source, the drain, the dielectric layer, and the gate conductive layer, after diffusing at least a portion of the diffusion layer to the dielectric layer.

The gate conductive layer may include a high resistance region that has greater electrical resistance than other portions of the gate conductive layer. The method may further include moving the high resistance region to the cathode. The method may further include measuring one of a drain current, a source current, a gate current, and a substrate current of a transistor including the source, the drain, the dielectric layer, and the gate conductive layer, after diffusing at least a portion of the diffusion layer and moving the high resistance region to the cathode.

According to example embodiments, a method of operating the antifuse may include breaking down the dielectric layer.

According to example embodiments, a method of manufacturing an antifuse may include forming a dielectric layer for an antifuse on a first conductor; forming a diffusion layer on the dielectric layer; and forming a second conductor on the diffusion layer.

The method may further include diffusing at least a portion of the diffusion layer to the dielectric layer. Diffusing at least a portion of the diffusion layer to the dielectric layer may include annealing the diffusion layer and the dielectric layer. The dielectric layer may include one of an Al oxide, a Si oxide, and a Si nitride, and the diffusion layer may include Cr.

BRIEF DESCRIPTION OF THE DRAWINGS

Example embodiments will be more clearly understood from the following detailed description taken in conjunction with the accompanying drawings. FIGS. 1A-12C represent non-limiting, example embodiments as described herein.

FIGS. 1A and 1B are a cross-sectional view and a plan view of an antifuse according to example embodiments before programming;

FIG. 2 is a cross-sectional view of the antifuse of FIG. 1A after programming, according to example embodiments;

FIG. 3 is a graph showing the energy band gap of a dielectric layer included in an antifuse according to example embodiments, before and after programming;

FIG. 4 is a cross-sectional view for explaining a method of programming the antifuse of FIG. 2, according to example embodiments;

FIG. 5 is a graph showing the characteristics of breakdown of dielectric layers that are included in an antifuse according to example embodiments and a comparison example of an antifuse;

FIG. 7 is a cross-sectional view of the antifuse of FIG. 6B after programming, according to example embodiments;

FIG. 8 is a cross-sectional view for explaining a programming method of the antifuse of FIG. 7, according to example embodiments;

FIGS. 12A-12C are cross-sectional views illustrating a method of manufacturing an antifuse, according to example embodiments.

Figure 1A:
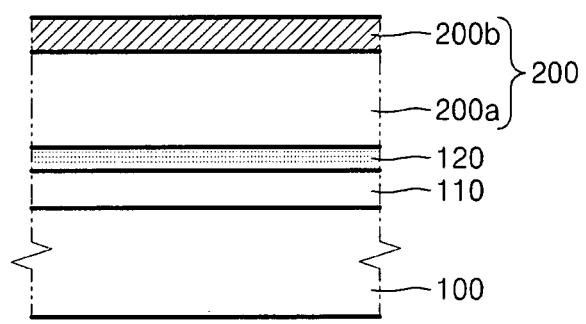

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. In the drawings, the thicknesses of layers and regions are exaggerated for clarity of the specification. Like reference numerals throughout the detailed description denote like elements. Example embodiments may, however, be embodied in many different forms and should not be construed as being limited to the embodiments set forth herein; rather, these embodiments may be provided so that this disclosure will be thorough and complete, and will fully convey the concept of example embodiments to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
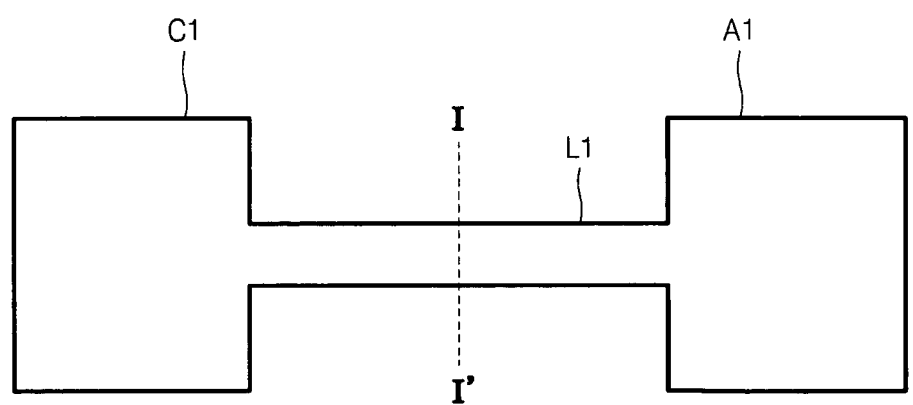

FIGS. 1A and 1B are cross-sectional views and plan views of an antifuse according to example embodiments before programming. Referring to FIG. 1A, the antifuse according to example embodiments may include a first dielectric layer 110 formed between a first conductor 100 and a second conductor 200. A diffusion layer 120 may be formed between the first dielectric layer 110 and one of the first conductor 100 and the second conductor 200. In FIG. 1A, a diffusion layer 120 may be formed between the first dielectric layer 110 and the second conductor 200. The first conductor 100 may be a portion of a substrate, e.g., a Si wafer, and a region that is doped with conductive impurities; however, the structure and materials of the first conductor 100 are not limited thereto. The second conductor 200 may have a structure including a lower layer 200a and an upper layer 200b that may be formed on the lower layer 200a. The lower layer 200a may be a polysilicon layer, and the upper layer 200b may be a silicide layer. However, the structure and materials of the second conductor 200 are not limited thereto. For example, the second conductor 200 may have a single or multiple metal-layer structure. If the second conductor 200 is a single metal-layer structure, the second conductor 200 may include one of Ti, TiN, Ta, TaN, TiSi, TaSi, TiSiN, TaSiN, TiAl$_3$, and TiON.

If the second conductor 200 is a double metal-layer structure, the lower layer 200a may include one of Ti, TiN, Ta, TaN, TiSi, TaSi, TiSiN, TaSiN, TiAl$_3$, and TiON, and the upper layer 200b may include one of W, Al, Cu, Ag, Au, and Pt. However, the metal of the second conductor 200 is not limited thereto, and may be various. The first dielectric layer 110 may be formed of a material for a dielectric layer of a typical capacitor, or a material for a gate dielectric layer of a typical transistor. For example, the material of the first dielectric layer 110 may be an oxide or a nitride, for example, an Al oxide, a Si oxide, or a Si nitride. The diffusion layer 120 may include a material, which is diffused to the first dielectric layer 110 by heat, and may decrease the energy band gap of the first dielectric layer 110. An example of this material of the diffusion layer 120 may be a metal, e.g., chromium (Cr). Because chromium (Cr) is more easily diffused to the first dielectric layer 110 by heat, and is bonded to an oxygen atom of the first dielectric layer 110 while diffusing and thus forms a chromium (Cr) oxide, chromium (Cr) may reduce the energy band gap of the first dielectric layer 110.

FIG. 1B is a plan view of the antifuse illustrated in FIG. 1A. For example, FIG. 1A is a cross-sectional view of a link L1 of FIG. 1B, cut along a line I-I'. Referring to FIG. 1B, the link L1 may be formed between a cathode C1 and an anode A1, being linear and having a smaller width than the widths of the cathode C1 and the anode A1. The link L1, the cathode C1, and the anode A1 may be formed on a predetermined or given substrate (not shown), and may have the same stacking structure as the structure from the first dielectric layer 110 to the second conductor 200 of FIG. 1A. A lower portion of the link L1 of the substrate may be equivalent to the first conductor 100 of FIG. 1A. The plan view shape of the antifuse according to example embodiments is not limited to the structure illustrated in FIG. 1B. For example, the shape and size ratios of the cathode C1 and the anode A1 may be variously changed, and the link L1 may also be modified.

When heating the diffusion layer 120 and the first dielectric layer 110 by applying a first current to the second conductor 200, e.g., to the upper layer 200b, of the antifuse having the structure illustrated in FIG. 1A, at least a portion of the diffusion layer 120 may be diffused to the first dielectric layer 110. In order to apply the first current to the second conductor 200, a first programming voltage may be applied between the cathode C1 and the anode A1 of FIG. 1B. The first programming voltage may be, for example, about 3 V, and the second conductor 200 in the portion of the link L1 may be heated to about 500° C. or more by the first programming voltage. As a result of this heating, at least a portion of the diffusion layer 120 of FIG. 1A may be diffused to the first dielectric layer 110. This diffusion may be referred to as a first programming operation. To conduct this first programming operation, instead of applying the first current or while applying the first current to the second conductor 200, another current may be applied to the first conductor 100.

Figure 2:
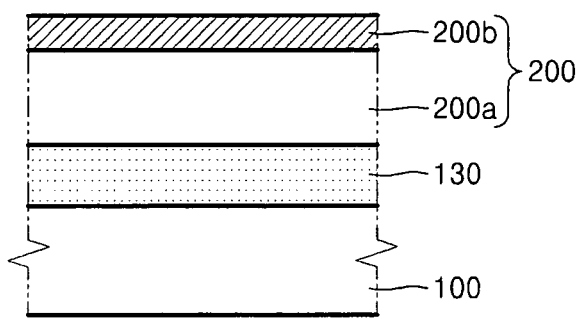

The result of the first programming operation is shown in FIG. 2. FIG. 2 is a cross-sectional view of the antifuse of FIG. 1A after programming, according to example embodiments. Referring to FIG. 2, a second dielectric layer 130 may be interposed between the first conductor 100 and the second conductor 200. The second dielectric layer 130 may be a layer that is formed by the reaction of the first dielectric layer 110 and the diffusion layer 120. For example, when the first dielectric layer 110 of FIG. 1A is an aluminum (Al) oxide layer and the diffusion layer 120 is a chromium (Cr) layer, the second dielectric layer 130 may be a layer in which an aluminum (Al) oxide and a chromium (Cr) oxide are bonded and/or mixed. The second dielectric layer 130 of FIG. 2 may be formed by diffusing the entire diffusion layer 120 of FIG. 1A to the entire region of the first dielectric layer 110, or sometimes a portion of the diffusion layer 120 may remain undiffused, and a portion of the first dielectric layer 110 may also not react with the material of the diffusion layer 120.

Figure 3:
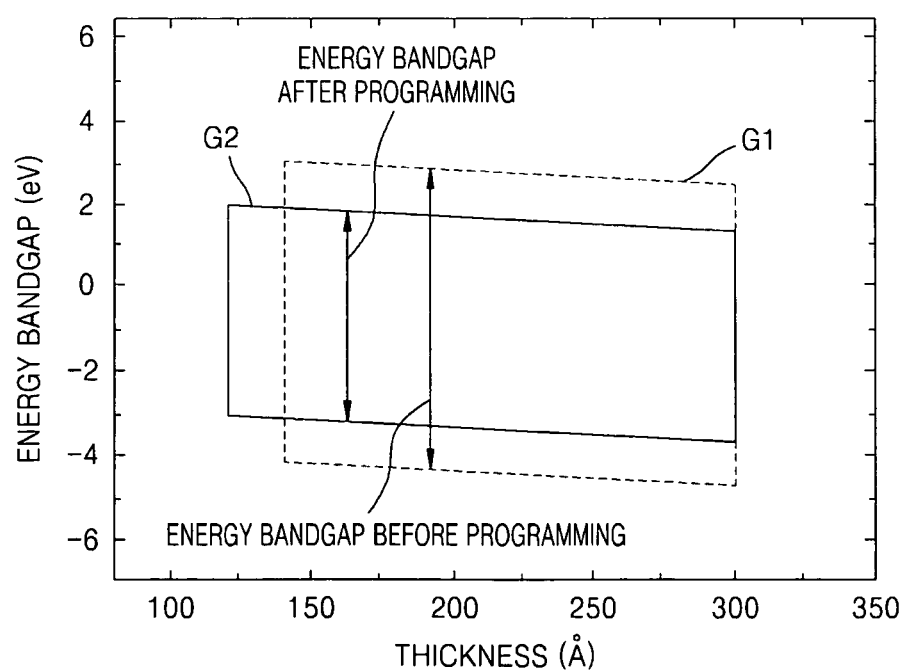

FIG. 3 is a graph showing the energy band gaps of the first dielectric layer 110 of FIG. 1A and the second dielectric layer 130 of FIG. 2. In FIG. 3, a first graph G1 is the energy band gap according to the thickness of the first dielectric layer 110, which may be formed of an Al oxide, and a second graph G2 is the energy band gap according to the thickness of the second dielectric layer 130, in which an Al oxide and a Cr oxide are bonded and/or mixed.

Referring to the first graph G1 of FIG. 3, the energy band gap of the first dielectric layer 110 formed of an Al oxide is about 6.5-7.0 eV. Referring to the graph G2, the energy band gap of the second dielectric layer 130 in which an Al oxide and a Cr oxide are bonded and/or mixed is about 5.5 eV. For example, the energy band gap of the first dielectric layer 110 before the first programming operation may be greater than the energy band gap of the second dielectric layer 130 after the first programming operation by about 20% or more. Therefore, the leakage current through the second dielectric layer 130 may be greater than the leakage current through the first dielectric layer 110. In addition, the dielectric constants of the first and second dielectric layers 110 and 130 may be different.

For example, because the dielectric constant of an Al oxide is about 9, and the dielectric constant of a Cr oxide is about 12-13, the dielectric constant of the first dielectric layer 110 may be less than that of the second dielectric layer 130. Accordingly, the electrical characteristics of the structures of FIGS. 1A and 2 may be different from each other. For example, the capacitances of the structures of FIGS. 1A and 2 may be different from each other, and the current (or electrical resistance) between the first conductor 100 and the second conductor 200 in the structures of FIGS. 1A and 2 may be different. Accordingly, by measuring the capacitance or the current (or electrical resistance) between the first conductor 100 and the second conductor 200, whether or not the antifuse is programmed by the first programming operation may be determined.

Figure 4:
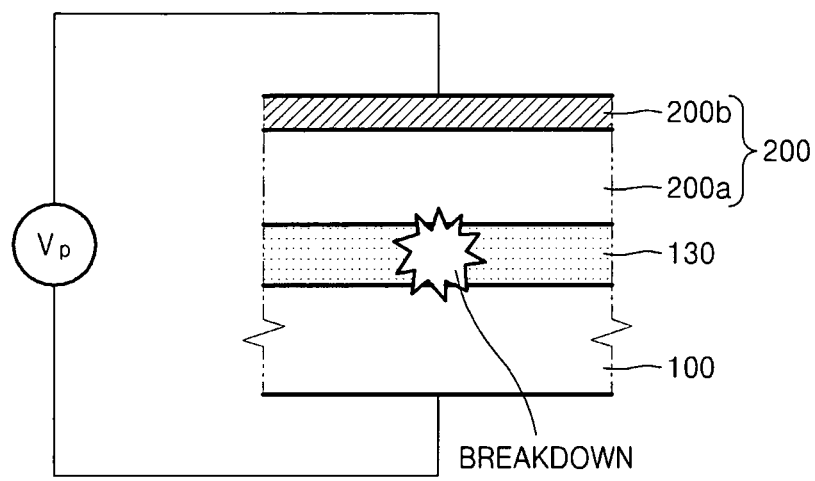

Another programming operation may be applied to the antifuse having the structure of FIG. 2. This programming operation will be referred to as a second programming operation. The second programming operation will be described with reference to FIG. 4. FIG. 4 is a cross-sectional view for explaining a method of programming the antifuse of FIG. 2, according to example embodiments.

Referring to FIG. 4, a second programming voltage Vp may be applied between the first conductor 100 and the second conductor 200. A breakdown of the second dielectric layer 130 may occur. The amplitude of the second programming voltage Vp required to break down the second dielectric layer 130 may differ according to the material and thickness of the second dielectric layer 130. The operation of breaking down the second dielectric layer 130 is referred to as the second programming operation.

A current between the first conductor 100 and the second conductor 200 after the second programming operation may be far greater than a current between the first conductor 100 and the second conductor 200 before the second programming operation. Accordingly, by sensing the difference in the currents between the first conductor 100 and the second conductor 200 before and after the second programming operation, whether or not the antifuse is programmed by the second programming operation may be determined. Because the second dielectric layer 130 is a layer in which a first dielectric material, e.g., an Al oxide, and a second dielectric material having a smaller energy band gap than the first dielectric material, e.g., a Cr oxide, are bonded and/or mixed, the second dielectric layer 130 may be more easily broken down using a lower programming voltage (the second programming voltage). This will be described with reference to FIG. 5.

Figure 5:
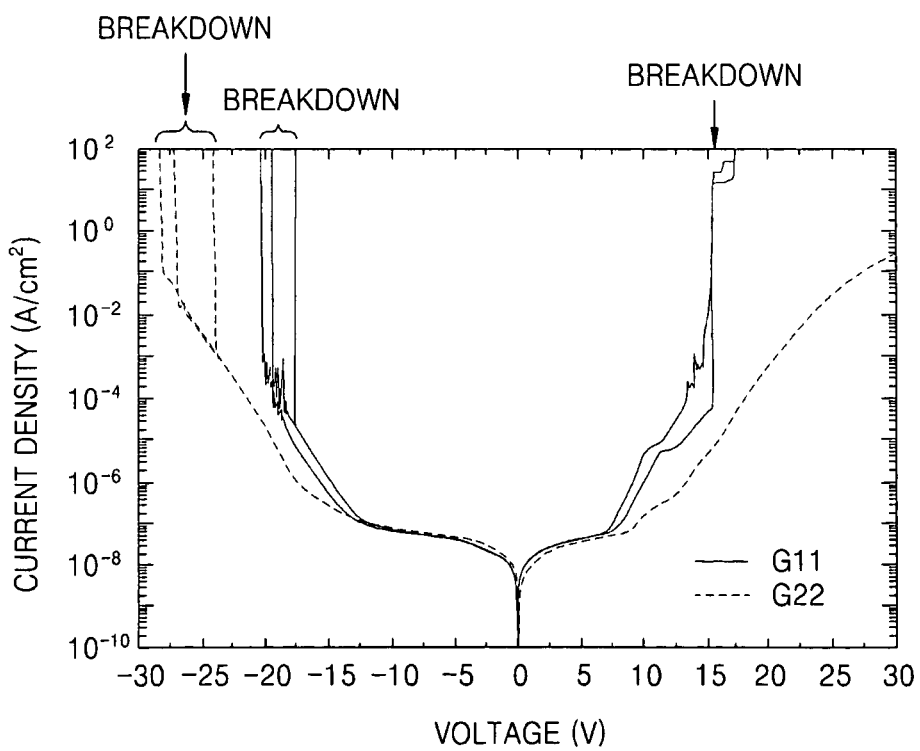

FIG. 5 is a graph showing the characteristics of breakdown of the antifuse according to example embodiments, for example, the antifuse of FIG. 2, and a comparison example of an antifuse. A first graph G11 of FIG. 5 shows the characteristics of breakdown of the antifuse of FIG. 2, for example, the variation of the current density according to voltages applied to the second dielectric layer 130 in the structure of FIG. 2. The second dielectric layer 130 may be a layer in which an Al oxide and a Cr oxide are bonded and/or mixed, having a thickness of about 30 nm and a size of about 100 μm×100 μm. A second graph G22 of FIG. 5 shows variation of the current density according to voltages applied to a dielectric layer of an antifuse according to the comparison example, wherein the dielectric layer may be formed of an Al oxide and interposed between two conductors. The thickness and size of the dielectric layer of the comparison example was about 20 nm and 100 μm×100 μm.

Referring to FIG. 5, the absolute value of a breakdown voltage of the first graph G11 may be less than the absolute value of a breakdown voltage of the second graph G22. Therefore, the second dielectric layer 130 of the antifuse according to example embodiments may be broken down at a relatively low voltage even though the thickness of the second dielectric layer 130 may be greater than that of the dielectric layer of the antifuse according to the comparison example. In other words, the antifuse of FIG. 2 having the second dielectric layer 130 in which an Al oxide and a Cr oxide are bonded and/or mixed may be programmed using a lower voltage than an antifuse having a dielectric layer formed of only an Al oxide. As described above, the antifuse according to example embodiments may be programmed using a lower programming voltage. Accordingly, by using the antifuse according to example embodiments, an off leakage current of a transistor in a cell region and a peripheral circuit region may be reduced, the reliability of the transistor may be improved, and the power consumption of the transistor may be reduced.

According to example embodiments, the structures of FIGS. 1A and 2, for example, the structures before and after diffusion of the diffusion layer 120 may correspond to states before and after programming, or the structure of FIG. 2 and the structure resulting from the process described with reference to FIG. 4 (breakdown) may correspond to states before and after programming, or the structure of FIG. 1A and the structure resulting from the process described with reference to FIG. 4 (breakdown) may correspond to states before and after programming.

As described above, after manufacturing an antifuse having the cross-section of FIG. 1A, the antifuse may be modified to have the cross-section of FIG. 2, and then, the second programming operation of FIG. 4 may be performed. In example embodiments, the material of the diffusion layer 120 may diffuse to the first dielectric layer 110 in a predetermined or given region of the link L1 (see FIG. 1B), for example, in a center portion of the link L1, as a result of the first programming operation, and a breakdown may occur in the center portion of the link L1 as a result of the second programming operation. However, according to example embodiments, an antifuse may be manufactured to have the cross-section of FIG. 2, and then, programmed according to the method described with reference to FIG. 4. In example embodiments, the antifuse before programming may have the stack structure of FIG. 2 in all regions of the cathode C1, the anode A1, and the link L1.

Figure 6A:
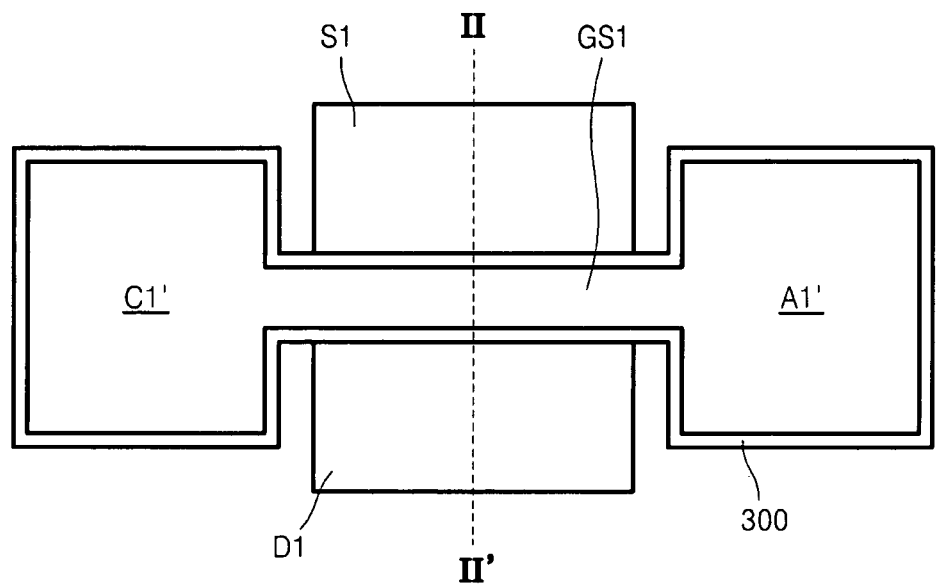
FIGS. 6A and 6B is a plan view and a cross-sectional view of an antifuse according to example embodiments before and after programming.
Figure 6B:
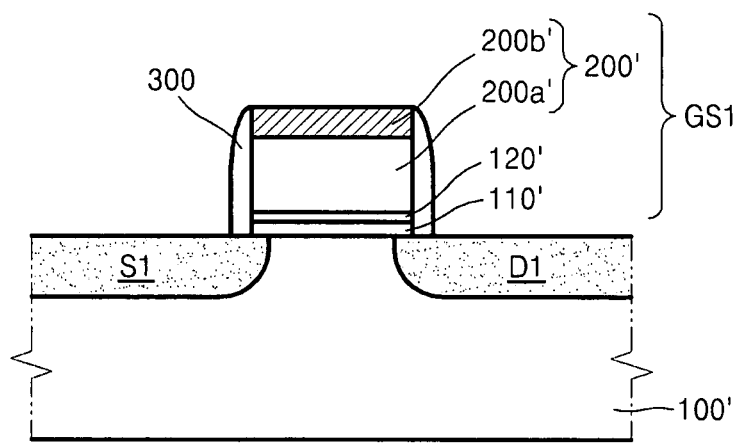

FIG. 6A is a plan view of an antifuse according to example embodiments, and FIG. 6B is a cross-sectional view of the antifuse of FIG. 6A cut along a line II-II'. Referring to FIG. 6A, a cathode C1' and an anode A1' may contact both ends of a gate stack GS1, which is linear-shaped and extends in a predetermined or given direction. The cathode C1', the anode A', and the gate stack GS1 may correspond to the cathode C1, the anode A, and the link L1 of FIG. 1B. The shapes and sizes of the cathode C1' and the anode A1' may be modified in various ways. A source S1 and a drain D1 may be disposed on both sides of the gate stack GS1. In FIG. 6A, the source S1 and the drain D1 may be rectangular, but the shape of the source S1 and the drain D1 is not limited thereto. An insulation spacer 300 may be further formed on sidewalls of the gate stack GS1, the cathode C1', and the anode A1'.

Referring to FIG. 6B, the gate stack GS1 may be formed on a substrate 100'. The substrate 100' may be a p− substrate that is doped at a lower density with a p-type impurity, or an n− substrate that is doped at a lower density with an n-type impurity. A portion of the substrate 100' below the gate stack GS1, for example, a channel region, may correspond to the first conductor 100 of FIG. 1A. The gate stack GS1 may include a first gate dielectric layer 110', a diffusion layer 120', and a gate conductive layer 200' that are sequentially formed on the substrate 100'. The gate conductive layer 200' may include a lower layer 200a' and an upper layer 200b', which is formed on the lower layer 200a'. The first gate dielectric layer 110', the diffusion layer 120', and the gate conductive layer 200' may correspond to the first dielectric layer 110, the diffusion layer 120, and the second conductor 200 of FIG. 1A, and thus descriptions thereof are not provided here.

The source S1 and the drain D1 may be disposed in the substrate 100' on both sides of the gate stack GS1. Each of the source S1 and the drain D1 may be an n+ region that is doped at a higher density with an n-type impurity, or a p+ region that is doped at a higher density with a p-type impurity. A portion of each of the source S1 and the drain D1 may overlap with first and second ends of a bottom surface of the first gate dielectric layer 110'. In example embodiments, each of the source S1 and the drain D1 may have a lightly doped drain (LDD) structure. A silicide layer (not shown) may be further formed on a surface of each of the source S1 and the drain D1. The silicide layer formed on the surface of each of the source S1 and the drain D1 may reduce contact resistance. The insulation spacer 300 may further be formed on sidewalls of the gate stack GS1.

The gate stack GS1 and the source S1 and the drain D1 constitute a transistor, and the transistor may be an n-channel metal-oxide semiconductor (NMOS) transistor or a p-channel metal-oxide semiconductor (PMOS) transistor. If the diffusion layer 120' and the first gate dielectric layer 110' are heated by applying a second current to the gate conductive layer 200' of FIG. 6B, at least a portion of the diffusion layer 120' may be diffused to the first gate dielectric layer 110'. In order to apply the second current to the gate conductive layer 200', a third programming voltage may be applied between the cathode C1' and the anode A1' of FIG. 6A. The third programming voltage may be similar to the above-described first programming voltage. When the third programming voltage is applied, the temperature of the gate conductive layer 200' in the gate stack GS1 may be raised to about 500° C. or more. At this temperature, at least a portion of the diffusion layer 120' of FIG. 6B may diffuse to the first gate dielectric layer 110'. This diffusion is referred to as a third programming operation.

Figure 7:
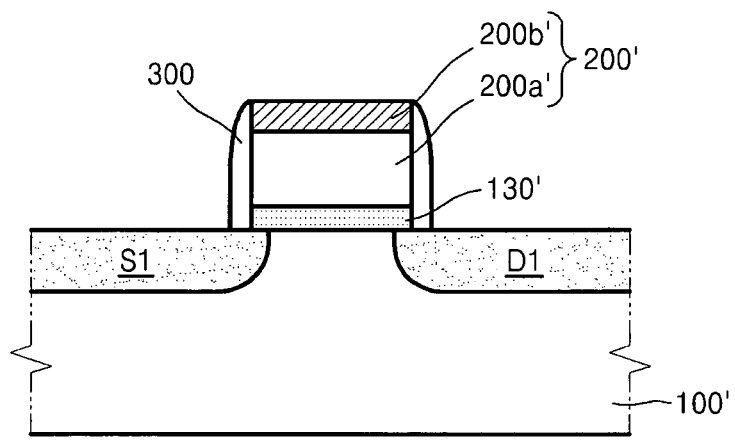

The result of the third programming operation is shown in FIG. 7. FIG. 7 is a cross-sectional view of the antifuse of FIG. 6B after programming, according to example embodiments. Referring to FIG. 7, a second gate dielectric layer 130' may be interposed between the substrate 100' and the gate conductive layer 200'. The second gate dielectric layer 130' may correspond to the second dielectric layer 130 of FIG. 2. The leakage currents through the first gate dielectric layer 110' of FIG. 6B and through the second gate dielectric layer 130' of FIG. 7 may be different, and the dielectric constants of the first gate dielectric layer 110' and the second gate dielectric layer 130' may be different from each other. Accordingly, the structures of FIGS. 6B and 7 may have different electrical characteristics. For example, one of a drain current Id, a source current Is, a gate current Ig, and a substrate current Isub that are measured from the structures of FIGS. 6B and 7 may be different between the two structures. The drain current Id, the source current Is, the gate current Ig, and the substrate current Isub may be measured by applying a gate voltage Vg, a source voltage Vs, and a drain voltage Vd to the gate conductive layer 200', the source S1 and the drain D1.

The gate current Ig and the substrate current Isub may be measured by applying a predetermined or given voltage between the substrate 100' and the gate conductive layer 200'. The drain current Id, the source current Is, the gate current Ig, and the substrate current Isub that are measured from the structure of FIG. 7 may be greater than the drain current Id, the source current Is, the gate current Ig, and the substrate current Isub measured from the structure of FIG. 6B. Accordingly, it may be determined whether or not the antifuse is programmed by the third programming operation by measuring one of the drain current Id, the source current Is, the gate current Ig, and the substrate current Isub. In addition, as the capacitances measured in the structures of FIGS. 6B and 7 may differ from each other, it may be determined whether or not the antifuse is programmed by the third programming operation by the variation in the capacitances of the antifuses of FIGS. 6B and 7.

Figure 8:
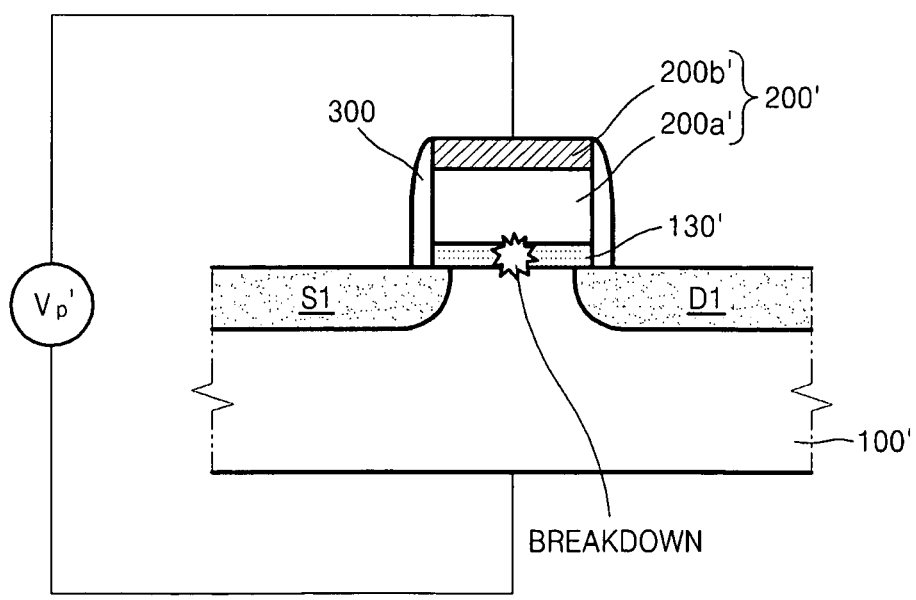

Another programming operation may be applied to the structure of FIG. 7. This programming operation will be referred to as a fourth programming operation. The fourth programming operation will be described with reference to FIG. 8. FIG. 8 is a cross-sectional view for explaining a programming method of the antifuse of FIG. 7, according to example embodiments. Referring to FIG. 8, the second gate dielectric layer 130' is broken down by applying a fourth programming voltage Vp' between the substrate 100' and the gate conductive layer 200'. The fourth programming voltage Vp' required to break down the second gate dielectric layer 130' of FIG. 8 may be as low as the second programming voltage Vp for breaking down the second dielectric layer 130 of FIG. 4. The operation of breaking down the second gate dielectric layer 130' is referred to as the fourth programming operation. The fourth programming operation may be similar to the above-described second programming operation. Although not illustrated in FIG. 8, in order to break down the second gate dielectric layer 130', a voltage may be applied between the gate conductive layer 200' and one of the source S1 and the drain D1, instead of applying the fourth programming voltage Vp' between the substrate 100' and the gate conductive layer 200'. In this case, a breakdown may occur in the portions of the second dielectric layer 130' that are overlapped with the source S1 and the drain D1.

The drain current Id, the source current Is, the gate current Ig, and the substrate current Isub measured after the fourth programming operation may be far greater than the drain current Id, the source current Is, the gate current Ig, and the substrate current Isub measured before the fourth programming operation. The drain current Id, the source current Is, the gate current Ig, and the substrate current Isub may be measured by applying a gate voltage Vg, a source voltage Vs, and a drain voltage Vd to the gate conductive layer 200', the source S1, and the drain D1. The gate current Ig and the substrate current Isub may be measured by applying a predetermined or given voltage between the substrate 100' and the gate conductive layer 200'. Accordingly, by measuring the drain current Id, the source current Is, the gate current Ig, and the substrate current Isub, it may be determined whether or not the antifuse is programmed by the fourth programming operation.

As described above, according to example embodiments, the structures of FIGS. 6B and 7 may correspond to states before and after programming, the structure of FIG. 7 and the process described with reference to FIG. 8 (breakdown) may correspond to states before and after programming, and the structure of FIG. 6B and the structure resulting from the process described with reference to FIG. 8 (breakdown) may correspond to states before and after programming.

As described above, after manufacturing an antifuse having a cross-section as illustrated in FIG. 6B and then modifying the antifuse to have a cross-section as illustrated in FIG. 7 as a result of the third programming operation, the fourth programming operation of FIG. 8 may be performed. In example embodiments, the material of the diffusion layer 120' may diffuse to the first gate dielectric layer 110' in a predetermined or given region of the gate stack GS1 (see FIG. 6A), for example, a center portion, as a result of the third programming operation, and breakdown may occur in the center portion of the gate stack GS1 as a result of the fourth programming operation.

Figure 9A:
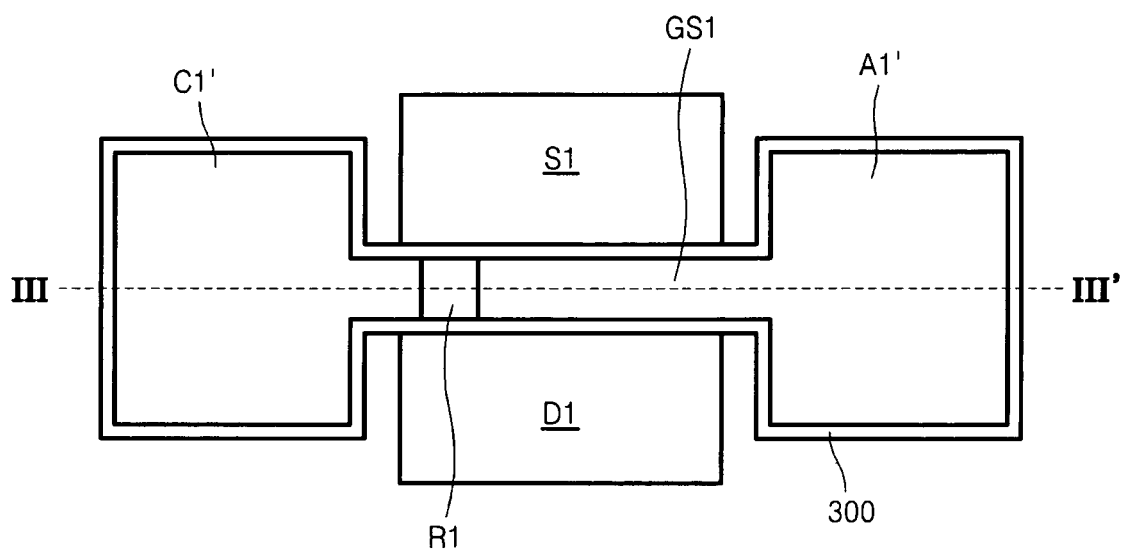
FIGS. 9A and 9B is a plan view and a cross-sectional view of an antifuse according to example embodiments before programming.
Figure 9B:
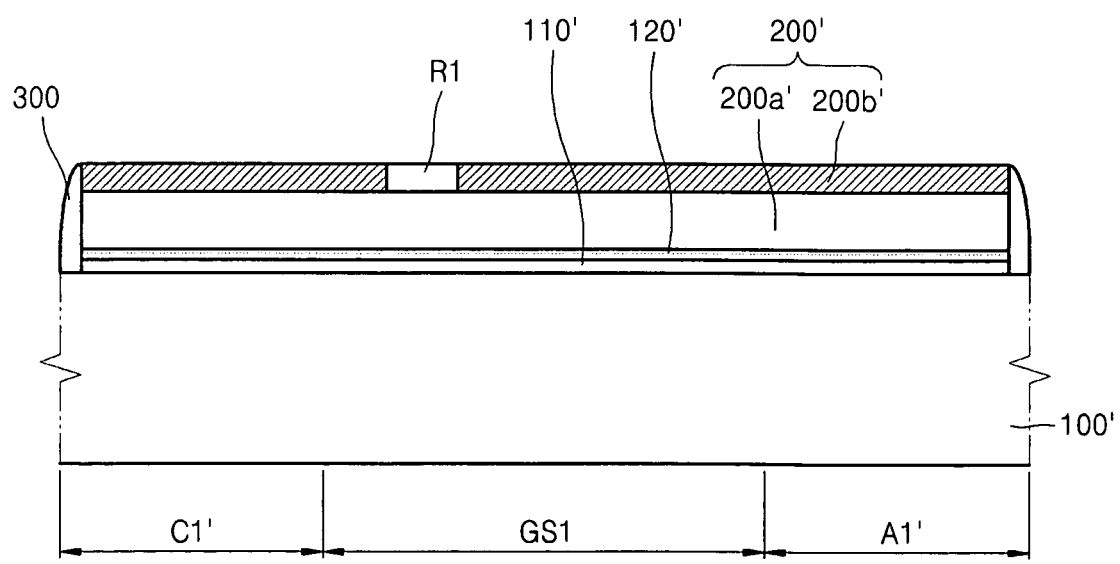

However, according to example embodiments, an antifuse may be manufactured to have the cross-section as illustrated in FIG. 7, and then programmed using the method described with reference to FIG. 8. In example embodiments, the antifuse before programming may have the stack structure of FIG. 7 in all regions of the cathode C1', the anode A1', and the gate stack GS1. FIG. 9A is a plan view of an antifuse according to example embodiments before programming. The antifuse illustrated in FIG. 9A may be identical to the antifuse of FIG. 6A except that the gate stack GS1 has a relatively high resistance region R1. FIG. 9B is a cross-sectional view of the antifuse of FIG. 9A cut along a line □-□' in FIG. 9A.

Referring to FIG. 9B, the high resistance region R1 may be formed in the upper layer 200b' of the gate conductive layer 200'. The high resistance region R1 may have a higher electrical resistance than the other portion of the upper layer 200b'. For example, the high resistance region R1 may be a polysilicon region, and the remaining portion of the upper layer 200b' may be formed of a silicide. As the lower layer 200a' is a polysilicon layer, the high resistance region R1 and the lower layer 200a' may be formed of the same material. However, example embodiments are not limited thereto. When the gate conductive layer 200' has a single or multiple metal-layer structure, a high resistance region that is similar to the high resistance region R1 may be formed by doping nitrogen, oxygen or resistive metal ions in local portions of the single or multiple metal-layer structure. The high resistance region R1 may be positioned nearer to the cathode C1' than the anode A1', and then, the high resistance region R1 may be more easily moved to the cathode C1'.

Figure 10A:
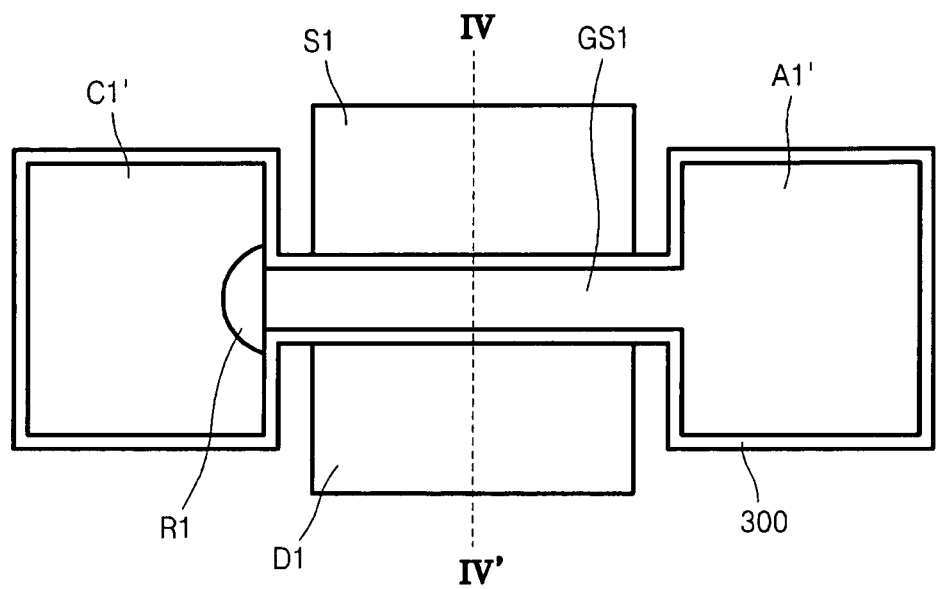
FIGS. 10A and 10B are a plan view and a cross-sectional view of the antifuse of FIGS. 9A and 9B after programming, according to example embodiments.
Figure 10B:
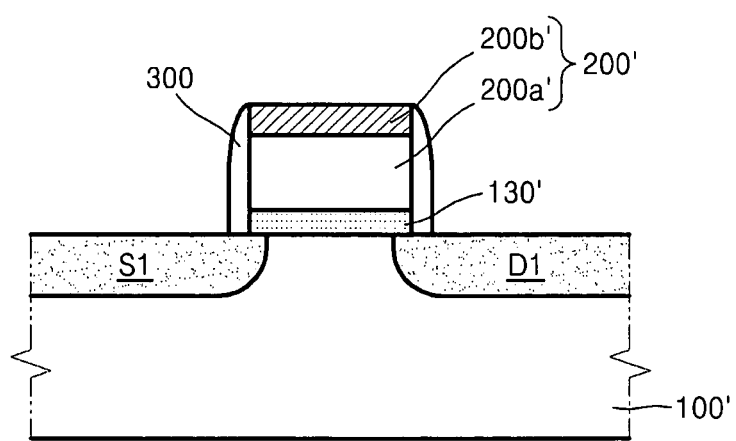

The high resistance region R1 may be moved to the inside of the cathode C1' by applying a third current to the gate conductive layer 200' of FIG. 9B, and at the same time, at least a portion of the diffusion layer 120' may be diffused to the first gate dielectric layer 110'. The high resistance region R1 may be moved by a general electromigration (EM) effect. The result of moving the high resistance region R1 to the inside of the cathode C1' and diffusing at least a portion of the diffusion layer 120' to the first gate dielectric layer 110' is shown in FIG. 10A and in FIG. 10B. FIGS. 10A and 10B are a plan view and a cross-sectional view of the antifuse of FIGS. 9A and 9B after programming, according to example embodiments. Hereinafter, an operation of modifying the structures of FIGS. 9A and 9B to the structures of FIGS. 10A and 10B is referred to as a fifth programming operation. As the position of the high resistance region R1 is moved from the gate stack GS1 to the inside of the cathode C1' and at least a portion of the diffusion layer 120' is diffused to the first gate dielectric layer 110', the electrical characteristics of the antifuse may be changed.

In detail, the electrical resistance of the gate conductive layer 200' may be lower when the high resistance region R1 is in the cathode C1' than when the high resistance region R1 is in the gate stack GS1. Also, as the diffusion layer 120' is diffused to the first gate dielectric layer 110' and thus a second gate dielectric layer 130' may be formed, a leakage current between the gate conductive layer 200' and the substrate 100' may be increased. Accordingly, the drain current Id, the source current Is, the gate current Ig, and the substrate current Isub of the antifuse after the fifth programming operation are greater than the drain current Id, the source current Is, the gate current Ig, and the substrate current Isub of the antifuse before the fifth programming operation. The variation of the electrical characteristics of the antifuse as a result of the fifth programming operation may be greater than the variation of the electrical characteristics of the antifuse as a result of the above-described third programming operation. This is because the diffusion layer 120' is diffused to the first gate dielectric layer 110' as a result of the fifth programming operation, and the position of the high resistance region R1 is changed accordingly.

The second gate dielectric layer 130' of FIG. 10B may be broken down by another programming operation, which will be referred to as a sixth programming operation. The sixth programming operation may be similar to the fourth programming operation of FIG. 8. The drain current Id, the source current Is, the gate current Ig, and the substrate Isub that are measured after the sixth programming operation may be far greater than the drain current Id, the source current Is, the gate current Ig, and the substrate Isub that are measured before the sixth programming operation.

Accordingly, according to example embodiments, the structures of FIGS. 9A and 10A may correspond to the states before and after programming, the structure of FIG. 10B and the structure in which the second gate dielectric layer 130' is broken down in the structures of FIG. 10B may correspond to states before and after programming, or the structure of FIG. 9A and the structure of FIG. 10B in which the second gate dielectric layer 130' is broken down may correspond to the states before and after programming.

As described above, after manufacturing an antifuse having a cross-section as illustrated in FIG. 9B and then modifying the antifuse to have a cross-section as illustrated in FIG. 10B as a result of the fifth programming operation, the sixth programming operation may be performed. In example embodiments, the material of the diffusion layer 120' may diffuse to the first gate dielectric layer 110' in a predetermined or given region of the gate stack GS1 (see FIG. 9B), for example, a center portion, as a result of the fifth programming operation, and a breakdown may occur in the center portion of the gate stack GS1 as a result of the sixth programming operation.

However, according to example embodiments, an antifuse may be manufactured to have a cross-section as illustrated in FIG. 10B, in which a high resistance region R1 may be formed in the gate stack GS1, and then, a programming operation of moving the high resistance region R1 to the cathode C1' and a programming operation of breaking down the second gate dielectric layer 130' may be performed. In example embodiments, the states before and after moving the high resistance regions R1 may correspond to states before and after programming, states before and after the breakdown of the second gate dielectric layer 130' may correspond to states before and after programming, and a state before moving the high resistance region R1 and a state after the breakdown of the second gate dielectric layer 130' may correspond to states before and after programming.

A plurality of antifuses according to example embodiments may be arranged in a two-dimensional array structure, and may be applied for various purposes to a semiconductor memory device, a logic device, a microprocessor, a field programmable gate array (FPGA), a one time programmable (OTP) device, and other very large scale integration (VLSI) circuits.

In the antifuse according to example embodiments, because changes in the electrical characteristics of the transistor due to the changes in the characteristics of the dielectric layer (gate dielectric layer) (e.g., variation of the energy band gap and the dielectric constant, and the variation of the leakage current due to break down) and the positional change of the high resistance region are used, a larger sensing margin may be provided compared to the conventional art. The larger the sensing margin, the simpler the structure of a sensing circuit (not shown) that is connected to the antifuse. Also, because the antifuse according to example embodiments may include a transistor, an additional programming transistor may not be needed. In addition, as the antifuse according to example embodiments is manufactured using a conventional semiconductor manufacturing process, the antifuse may be more easily manufactured together with a device of a cell region, e.g., a memory array.

Figure 11A:
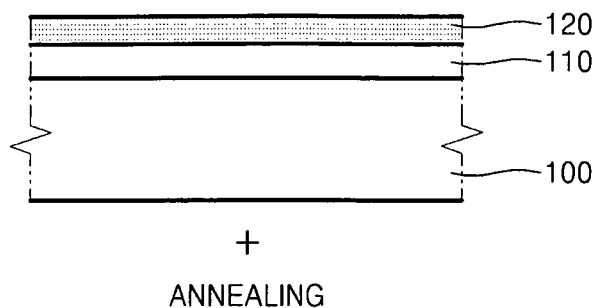
FIGS. 11A-11D are cross-sectional views illustrating a method of manufacturing an antifuse, according to example embodiments.
Figure 11B:
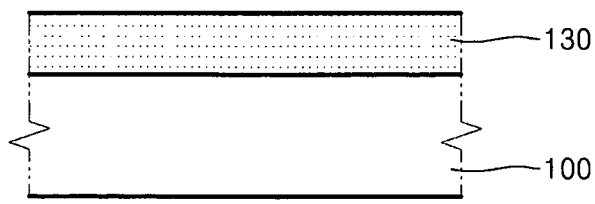

Hereinafter, methods of manufacturing the antifuse according to example embodiments will be briefly described. The antifuse of FIG. 11A may be manufactured by sequentially stacking a first dielectric layer 110, a diffusion layer 120, and a second conductor 200 in that order on a first conductor 100, and then, patterning the first dielectric layer 110, the diffusion layer 120, and the second conductor 200. The first conductor 100 may be a portion of a substrate. The antifuse having a cross-section as illustrated in FIG. 2 in all regions of a cathode, an anode, and a link will be described with reference to FIGS. 11A-11D. Referring to FIG. 11B, a second dielectric layer 130 may be on the first conductor 100. The second dielectric layer 130 may be a layer that is formed by the reaction of the first dielectric layer 110 and the diffusion layer 120. For example, when the first dielectric layer 110 of FIG. 11A is an aluminum (Al) oxide layer and the diffusion layer 120 is a chromium (Cr) layer, the second dielectric layer 130 may be a layer in which an aluminum (Al) oxide and a chromium (Cr) oxide are bonded and/or mixed.

The antifuse having a cross-section as illustrated in FIG. 2 in all regions of a cathode, an anode, and a link will be described with reference to FIGS. 11A through 11D. Referring to FIG. 11A, a first dielectric layer 110 and a diffusion layer 120 may be sequentially formed on a first conductor 100 in this order. The first dielectric layer 110 may be formed of a dielectric material of a typical capacitor or a material of a gate dielectric layer of a typical transistor. For example, the first dielectric layer 110 may be formed of one of an Al oxide, a Si oxide, and a Si nitride. The diffusion layer 120 may include a material, which is diffused to the first dielectric layer 110 by heat and reduces the energy band gap of the first dielectric layer 110. For example, the diffusion layer 120 may include a metal, e.g., Cr.

The first dielectric layer 110 and the diffusion layer 120 may be annealed at a predetermined or given temperature, for example, about 500-1000° C. (hereinafter, first annealing process). The first annealing process may be a rapid thermal annealing (RTA) process. As a result of the first annealing process, at least a portion of the diffusion layer 120 may be diffused to the first dielectric layer 110, thereby forming a second dielectric layer 130 as illustrated in FIG. 11B. The time for performing the first annealing process may vary. When the first dielectric layer 110 of FIG. 11A is an Al oxide layer, and the diffusion layer 120 is a Cr layer, the second dielectric layer 130 of FIG. 11B may be a layer in which an Al oxide and a Cr oxide are bonded and/or mixed. After the first annealing process, if a portion of the diffusion layer 120 remains, a wet washing process to remove the remaining portion may be performed, and a post annealing process may be further performed. The post annealing process may be a RTA process.

Figure 11C:
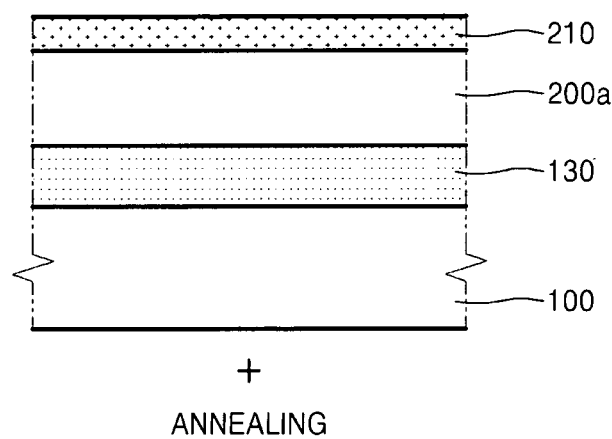
Figure 11D:
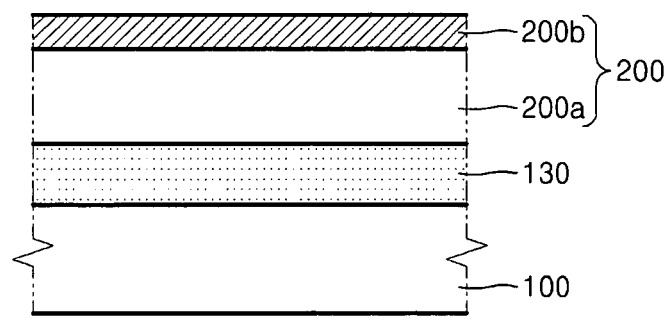

Referring to FIG. 11C, a lower layer 200a may be formed on the second dielectric layer 130. The lower layer 200a may be formed of, for example, a conductive polysilicon. A metal layer 210 may be formed on the lower layer 200a. A second annealing process may be performed so that a silicide reaction may occur between the metal layer 210 and the lower layer 200a, thereby forming an upper layer 200b as illustrated in FIG. 11D, and an unreacted portion of the metal layer 210 may be removed. The lower layer 200a and the upper layer 200b may constitute a second conductor 200. The structure and material of the second conductor 200 may be variously modified. Different example embodiments of the second conductor 200 have been described above, and thus, a description thereof is not provided here.

Figure 12A:
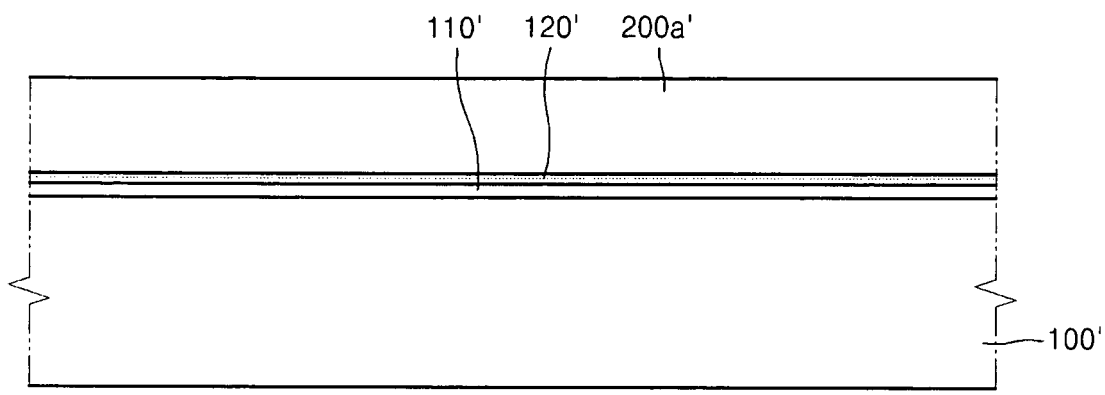
Figure 12B:
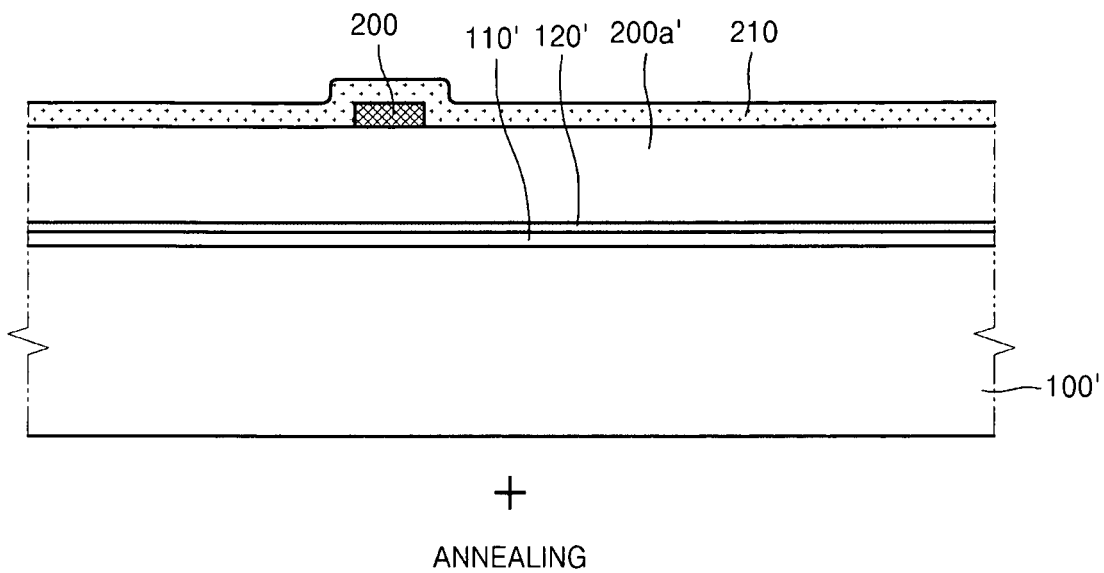
Figure 12C:
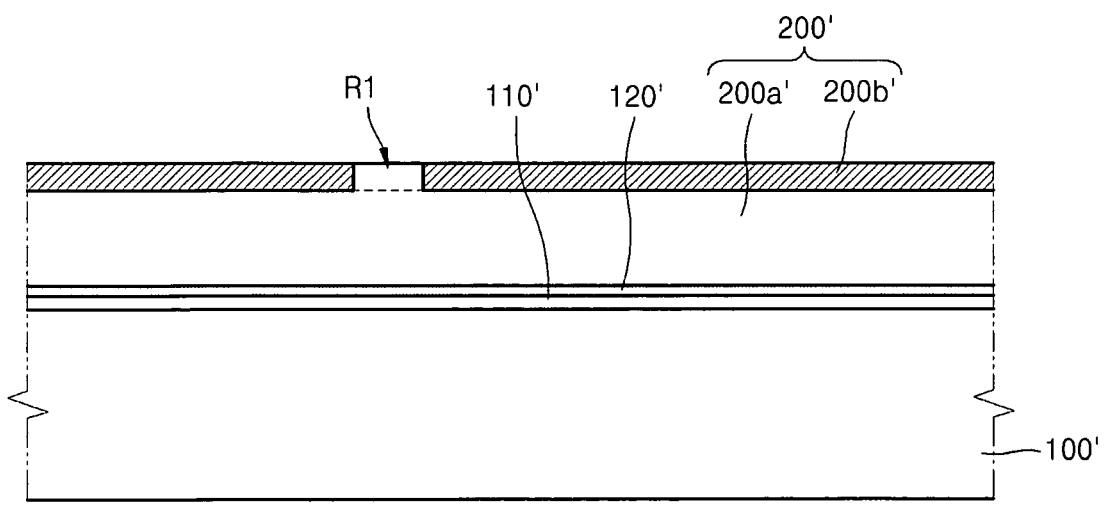

The method of manufacturing the antifuse described with reference to FIGS. 11A-11D may be applied to the antifuses having the cross-sections of FIGS. 7 and 10B. A method of manufacturing the antifuse having the cross-section of FIG. 9B will be described with reference to FIGS. 12A-12C. Referring to FIG. 12A, a first gate dielectric layer 110', a diffusion layer 120', and a lower layer 200a' may be sequentially formed on a substrate 100' in that order. The materials of the first gate dielectric layer 110', the diffusion layer 120', and the lower layer 200a' are as described above, and thus descriptions thereof are not provided here. Referring to FIG. 12B, a mask layer 200 may be formed in a predetermined or given region of the lower layer 200a'. The mask layer 200 may be formed of an insulating material, e.g., a silicon nitride or a silicon oxide. A metal layer 210 covering the mask layer 200 may be formed on the lower layer 200a'. A third annealing process may be performed so that a silicide reaction may occur between the lower layer 200a' and the metal layer 210, thereby forming an upper layer 200b' as illustrated in FIG. 12C, and unreacted portions of the metal layer 210 and unreacted mask layer 200 may be removed. During the third annealing process, the portion of the lower layer 200a', which is covered by the mask layer 220 (see FIG. 12B), may not react with the metal layer 210, and thus, may not be silicidized. As a result, this portion of the lower layer 200a' may become a high resistance region R1 that has a higher resistance than the upper layer 200b'. Referring to FIG. 12C, the lower layer 200a' and the upper layer 200b' may constitute a gate conductive layer 200'.

When the gate conductive layer 200' is a single-layer or multi-layer metal structure, a local high resistance region may be formed by doping a portion of the gate conductive layer 200' with nitrogen, oxygen, or resistive metal ions. By using the method described with reference to FIGS. 11A-11D, the method described with reference to FIGS. 12A-12C, and the method of manufacturing a transistor, the antifuses according to example embodiments may be manufactured by one of ordinary skill in the art.

While example embodiments have been particularly shown and described with reference to example embodiments thereof, example embodiments should be considered in descriptive sense only and not for purposes of limitation. For example, it will be understood by those of ordinary skill in the art that various changes in structure and elements of the antifuses of FIGS. 1A, 1B, 2, 4, 6A, 6B, 7, 8, 9A, 9B, 10A, and 10B may be made. For example, the sizes of the cathodes C1 and C1' and the anodes A1 and A1' may be different, and the form of the cathodes C1 and C1', the anodes A1 and A1', the link L1 and the gate stack GS1 may be modified variously, and the substrate 100' may be a bulk silicon (Si) substrate, a silicon on insulator (SOI) substrate, a GaAs substrate, or other kinds of substrate. Therefore, the scope of example embodiments is defined not by the detailed description of example embodiments but by the appended claims.

What is claimed is:

1. An antifuse comprising:
   first and second conductors separate from each other;
   a dielectric layer between the first and second conductors; and
   a diffusion layer between one of the first and second conductors and the dielectric layer,
   wherein the dielectric layer includes chromium (Cr) that is diffused from the diffusion layer, and
   wherein the second conductor includes a lower layer and an upper layer, the lower layer including polysilicon and the upper layer including silicide.

2. The antifuse of claim 1, wherein the Cr of the diffusion layer reduces the energy band gap of the dielectric layer and/or increases a dielectric constant of the dielectric layer.

3. The antifuse of claim 1, wherein the dielectric layer includes at least one of an Al oxide, a Si oxide, and a Si nitride.

4. The antifuse of claim 1, wherein the dielectric layer, the diffusion layer, and the second conductor are sequentially stacked on the first conductor defining a first stack pattern, further comprising:
   a cathode and an anode contacting both ends of the first stack pattern, the widths of the cathode and the anode being greater than the width of the first stack pattern.

5. The antifuse of claim 4, wherein the first conductor is a portion of a substrate, and the second conductor is a gate conductive layer, further comprising:
   a source and a drain on the substrate on both sides of the first stack pattern.

6. The antifuse of claim 5, wherein the gate conductive layer includes a high resistance region having greater electrical resistance than other portions of the gate conductive layer.

7. A method of operating the antifuse of claim 1, comprising:
   diffusing at least a portion of the diffusion layer to the dielectric layer.

8. The method of claim 7, wherein diffusing at least a portion of the diffusion layer to the dielectric layer includes applying a current to either of the first or the second conductor contacting the diffusion layer.

9. The method of claim 7, after diffusing at least a portion of the diffusion layer to the dielectric layer, further comprising:
   measuring the capacitance of the antifuse or a current between the first and second conductors.

10. The method of claim 7, after diffusing at least a portion of the diffusion layer to the dielectric layer, further comprising:
    breaking down the dielectric layer; and
    measuring a current between the first and second conductors.

11. The method of claim 7, wherein the dielectric layer, the diffusion layer, and the second conductor are sequentially stacked on the first conductor to define a first stack pattern, and the antifuse further comprises:
    a cathode and an anode contacting both ends of the first stack pattern, and the widths of the cathode and the anode are greater than the width of the first stack pattern.

12. The method of claim 11, wherein the first conductor is a portion of a substrate, and the second conductor is a gate conductive layer, further comprising:
    providing a source and a drain on the substrate on both sides of the first stack pattern.

13. The method of claim 12, further comprising:
    measuring one of a drain current, a source current, a gate current, and a substrate current of a transistor including the source, the drain, the dielectric layer, and the gate conductive layer, after diffusing at least a portion of the diffusion layer to the dielectric layer.

14. The method of claim 12, wherein the gate conductive layer includes a high resistance region that has greater electrical resistance than other portions of the gate conductive layer.

15. The method of claim 14, further comprising:
    moving the high resistance region to the cathode.

16. The method of claim 15, further comprising:
    measuring one of a drain current, a source current, a gate current, and a substrate current of a transistor including the source, the drain, the dielectric layer, and the gate conductive layer, after diffusing at least a portion of the diffusion layer and moving the high resistance region to the cathode.

17. A method of manufacturing an antifuse, the method comprising:
    forming a dielectric layer on a first conductor;
    forming a diffusion layer on the dielectric layer; and
    forming a second conductor on the diffusion layer,
    wherein the forming a dielectric layer includes diffusing chromium (Cr) from the diffusion layer into the dielectric layer, and
    wherein the forming a second conductor includes forming a lower layer and an upper layer on the diffusion layer, the lower layer including polysilicon and the upper layer including silicide.

18. The method of claim 17, wherein the diffusing Cr includes annealing the diffusion layer and the dielectric layer.

19. The method of claim 17, wherein the dielectric layer includes one of an Al oxide, a Si oxide, and a Si nitride.

* * * * *